United States Patent
Childress et al.

(10) Patent No.: US 12,204,005 B2
(45) Date of Patent: Jan. 21, 2025

(54) MAGNETORESISTIVE SENSOR ELEMENT HAVING A WIDE LINEAR RESPONSE AND ROBUST NOMINAL PERFORMANCE AND MANUFACTURING METHOD THEREOF

(71) Applicant: Allegro MicroSystems, LLC, Manchester, NH (US)

(72) Inventors: Jeffrey Childress, San Jose, CA (US); Nikita Strelkov, Meylan (FR); Andrey Timopheev, Vif (FR)

(73) Assignee: Allegro MicroSystems, LLC, Manchester, NH (US)

( * ) Notice: Subject to any disclaimer, the term of this patent is extended or adjusted under 35 U.S.C. 154(b) by 147 days.

(21) Appl. No.: 18/251,296

(22) PCT Filed: Oct. 28, 2021

(86) PCT No.: PCT/IB2021/059971
§ 371 (c)(1),
(2) Date: May 1, 2023

(87) PCT Pub. No.: WO2022/096992
PCT Pub. Date: May 12, 2022

(65) Prior Publication Data
US 2024/0019509 A1  Jan. 18, 2024

(30) Foreign Application Priority Data
Nov. 3, 2020 (EP) ...................................... 20315443

(51) Int. Cl.
G01R 33/09 (2006.01)
G01R 33/00 (2006.01)
H01F 1/00 (2006.01)

(52) U.S. Cl.
CPC ....... *G01R 33/098* (2013.01); *G01R 33/0052* (2013.01); *G01R 33/093* (2013.01); *H01F 1/0009* (2013.01)

(58) Field of Classification Search
CPC .............. G01R 33/098; G01R 33/0052; G01R 33/093; G01R 33/0082; G01R 33/14; G01R 33/096; H01F 1/0009
See application file for complete search history.

(56) References Cited

U.S. PATENT DOCUMENTS

2005/0174701 A1  8/2005  Kasiraj et al.
2007/0253122 A1* 11/2007  Fukuzawa ............... G11C 11/16
                                                  360/324.11

(Continued)

FOREIGN PATENT DOCUMENTS

EP    3104187 A1   12/2016
JP    2001338407 A 12/2001

OTHER PUBLICATIONS

International Search Report issued in Application No. PCT/IB2021/059971 dated Jan. 31, 2022.
Written Opinion for PCT/IB2021/059971 dated Jan. 31, 2022.

*Primary Examiner* — Alvaro E Fortich
(74) *Attorney, Agent, or Firm* — DALY, CROWLEY, MOFFORD & DURKEE, LLP

(57) ABSTRACT

A magnetoresistive element for a magnetic sensor, the magnetoresistive element including a tunnel barrier layer between a reference layer having a fixed reference magnetization and a sense layer having a free sense magnetization, wherein the sense magnetization includes a stable vortex configuration. The magnetoresistive element further includes a reference pinning layer in contact with the reference layer and pining the reference magnetization by exchange-bias at a first blocking temperature. The magnetoresistive element further includes a sense pinning layer in (Continued)

contact with the sense layer and pining the sense magnetization by exchange-bias at a second blocking temperature lower that the first blocking temperature. Additionally, a method for manufacturing the magnetoresistive element.

8 Claims, 5 Drawing Sheets

(56) References Cited

U.S. PATENT DOCUMENTS

| | | | |
|---|---|---|---|
| 2009/0027048 A1* | 1/2009 | Sato | G01R 33/09 29/602.1 |
| 2013/0134969 A1* | 5/2013 | Ohta | G01R 33/093 324/252 |
| 2015/0063019 A1 | 3/2015 | Dieny | |
| 2017/0168122 A1 | 6/2017 | Raberg et al. | |
| 2017/0212175 A1* | 7/2017 | Holm | G01R 33/0005 |
| 2018/0292473 A1* | 10/2018 | Childress | G01R 33/098 |
| 2018/0356474 A1 | 12/2018 | Hammerschmidt et al. | |

* cited by examiner

MAGNETORESISTIVE SENSOR ELEMENT HAVING A WIDE LINEAR RESPONSE AND ROBUST NOMINAL PERFORMANCE AND MANUFACTURING METHOD THEREOF

CROSS-REFERENCE TO RELATED APPLICATIONS

This application is a national phase of PCT/IB2021/059971 filed on Oct. 28, 2021, which claims the priority of European Application No. 20315443.0, filed on Nov. 3, 2020. The entire contents of these applications are hereby incorporated by reference in their entireties.

TECHNICAL DOMAIN

The present invention concerns a magnetoresistive element adapted to sense an external magnetic field and having a wide linear response and a nominal performance that remains substantially unchanged after the magnetoresistive element has been subjected to high magnetic fields. The present invention further concerns a method for manufacturing the magnetoresistive element and a magnetic sensor comprising a plurality of the magnetoresistive element.

RELATED ART

FIG. 1 shows a cross-section view of a conventional magnetoresistive sensor element 2 comprising a ferromagnetic reference layer 21 having a reference magnetization 210, a ferromagnetic sense layer 23 having an averaged free sense magnetization 230 and a tunnel barrier layer 22 between the reference and sense ferromagnetic layers 21, 23. The sense magnetization 230 can be oriented in an external magnetic field 60 while the reference magnetization 210 remains substantially undisturbed. The external magnetic field 60 can thus be sensed by measuring a resistance of the magnetoresistive sensor element 2. The resistance depends on the orientation and magnitude of the averaged sense magnetization 230 relative to the reference magnetization 210. The reference magnetization 210 can be pinned by exchange coupling between a antiferromagnetic layer 24 and the reference layer 21.

FIGS. 2a and 2b illustrate a top view of the sense layer 23, wherein the sense magnetization 230 comprises a stable vortex configuration. In the vortex configuration, the magnetization curls in a circular path along the edge of the sense layer 23 and around a core 231 reversibly movable in accordance to the external magnetic field 60. The vortex configuration provides a linear and non-hysteretic behavior in a large magnitude range of the external magnetic field 60, for practical size of the magnetoresistive sensor element 2 and thickness of the sense layer 23. The vortex configuration is thus advantageous for magnetic sensor applications.

The obtention of a vortex configuration in the sense layer 23 depends on a number of factors, including materials properties of the sense layer 23. Generally, the vortex configuration is favored (at zero applied field) by varying the aspect ratio of the thickness on the diameter of the sense layer 23. The aspect ratio is still typically much less than 1 (for example 0.01 to 0.5). More particularly, FIG. 2a shows the sense magnetization 230 in absence of the external magnetic field 60 with the core 231 of the vortex configuration being substantially at the center of the sense layer cross-section. In this configuration, the sense layer 23 has a net magnetic moment that is substantially zero (M=0). FIG. 2b shows the sense magnetization 230 in the presence of the external magnetic field 60. The external magnetic field 60 causes the core 231 to move in a direction (shown by the doted arrow) substantially perpendicular to the one of the external magnetic field 60. The displacement of the core 231 results in a net magnetic moment (M≠0) in the sense layer 23. In particular, a displacement of the core 231 towards the right (as shown in FIG. 2b) results in a net magnetic moment M>0 (positive axis is pointing along the applied field 60) in the sense layer 23, whereas a displacement of the core 231 towards the left (not shown), when the external magnetic field 60 is oriented opposed to the direction shown in FIG. 2b, results in a net magnetic moment M<0 in the sense layer 23.

FIG. 3 shows a hysteresis response (or magnetization curve) to the external magnetic field 60 ($H_{ext}$, in arbitrary unit) on the sense magnetization 230 (M, in arbitrary unit) of the conventional magnetoresistive sensor element. The full hysteresis loop of a vortex sense magnetization 230 is characterized by a linear increase of magnetization M with the applied magnetic field $H_{ext}$ until the vortex expulsion field is reached at the $H_{expl}$ point. At this point the sense magnetization 230 becomes magnetically saturated. To recover the vortex state in the sensing layer 23, one needs to reduce the magnetic field below the nucleation field $H_{nucl}$, where the nucleation field $H_{nucl}$ is the field at which vortex re-forms after high-field vortex expulsion. As long as the applied magnetic field is within the magnitudes corresponding to the expulsion field ($+/-H_{expl}$) of the vortex in the sense magnetization 230, the hysteresis response to the external magnetic field 60 comprises a reversible linear portion corresponding to the movement of the core 231 with the external magnetic field 60. The values and the slope of the linear part of hysteresis loop are strongly dependent on the size of the sense layer 23. The linear and non-hysteretic portion of the magnetization curve facilitates the measurement of small variations of the external magnetic field $H_{ext}$.

In particular, the vortex is characterized by its susceptibility $\chi$, which corresponds to the slope of the linear region of the M(H) loop:

$$\chi = \partial M / \partial H_{ext} \quad (1).$$

The sensitivity S of the magnetoresistive sensor element 2 then will be proportional to the product between the susceptibility $\chi$ and the tunnel magnetoresistance (TMR) of the magnetoresistive sensor element 2:

$$S = \chi * TMR \quad (2).$$

When performing magnetic permeability testing on a magnetic sensor device comprising a plurality of the magnetoresistive sensor element 2, the magnetoresistive sensor element 2 should be able to be subjected to high magnetic fields, such as magnetic fields greater than 200 mT, without significant change in their nominal performance. However, a vortex-based magnetic sensor device is typically configured to operate at low magnetic fields, for example smaller than 100 mT. The performance of a vortex-based magnetic sensor device is often changed when subjected to a high magnetic field used in magnetic permeability testing. In particular, the vortex-based magnetic sensor device may suffer from zero-field offset shifts that reduces the sensor accuracy when sensing low magnetic fields.

Moreover, the vortex-based magnetic sensor device has a linear response only in a limited range of magnetic field magnitude.

Document EP3104187 discloses a magnetoresistive sensor comprising a magnetic sensing layer, a magnetic reference layer, and a tunnel barrier layer between the magnetic sensing layer and the magnetic reference layer. The magnetoresistive sensor also comprises a sensing exchange layer having a layer of anti-ferromagnetic material. The sensing exchange layer is exchange coupled with the magnetic sensing layer. Also, the magnetoresistive sensor still further comprises a reference exchange layer having a layer of anti-ferromagnetic material. The reference exchange layer is exchange coupled with the magnetic reference layer.

Document US2018356474 discloses a magnetoresistive sensor including a magnetic reference layer. The magnetic reference layer includes a permanent closed flux magnetization pattern of a predetermined rotational direction. Furthermore, the magnetoresistive sensor includes a magnetic free layer. The magnetic free layer has a total lateral area that is smaller than a total lateral area of the magnetic reference layer. A centroid of the magnetic free layer is laterally displaced with respect to a centroid of the magnetic reference layer.

SUMMARY

The present disclosure concerns a magnetoresistive element for a magnetic sensor, the magnetoresistive element comprising a tunnel barrier layer included between a reference layer having a fixed reference magnetization and a sense layer having a free sense magnetization, wherein the sense magnetization comprises a stable vortex configuration. The magnetoresistive element further comprises a reference pinning layer in contact with the reference layer and pining the reference magnetization by exchange-bias at a first blocking temperature. The magnetoresistive element further comprises a sense pinning layer in contact with the sense layer and pining the sense magnetization by exchange-bias at a second blocking temperature lower that the first blocking temperature. The sense layer has a thickness between 15 nm and 80 nm. The strength of exchange-bias between the sense pinning layer and the sense layer is between $2\times10^{-8}$ $J/cm^2$ and $4\times10^{-8}$ $J/cm^2$.

The present disclosure further concerns a magnetic sensor comprising a plurality of the magnetoresistive element.

The present disclosure further concerns a method for manufacturing the magnetoresistive element comprising the steps of depositing the reference pinning layer, reference layer, tunnel barrier layer, sense layer, and sense pinning layer, wherein the sense pinning layer is configured such that the magnitude of the exchange-bias generated in the sense layer by the sense pinning layer is between $2\times10^{-8}$ $J/cm^2$ and $4\times10^{-8}$ $J/cm^2$; annealing the reference layer with an applied external magnetic field at an annealing temperature higher than the first blocking temperature; and annealing the sense layer in the absence of an applied external magnetic field at an annealing temperature higher than the second blocking temperature and lower than the first blocking temperature.

The magnetoresistive element disclosed herein has a wide linear response. The magnetoresistive element further has nominal performance that remains substantially unchanged after the magnetoresistive element has been subjected to high magnetic fields, such as magnetic fields used when performing magnetic permeability testing. In other words, the magnetoresistive element has reduced zero-field offset shifts due to a more stable and reproducible vortex structure. The vortex structure is characterized by a large vortex nucleation field $H_{nucl}$.

SHORT DESCRIPTION OF THE DRAWINGS

Exemplar embodiments of the invention are disclosed in the description and illustrated by the drawings in which.

Figure 6:
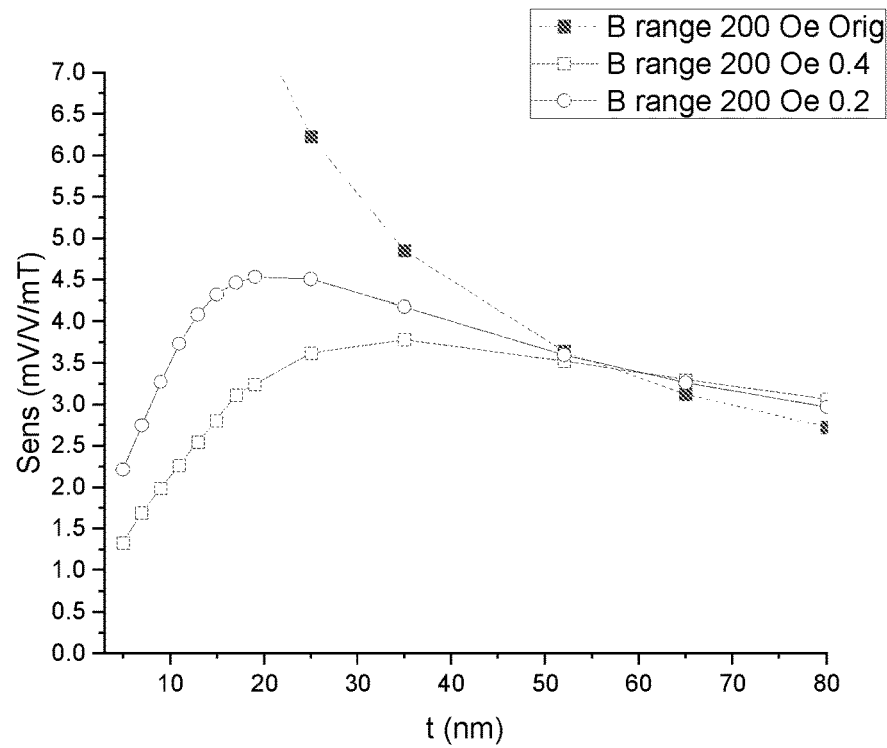
Figure 7:
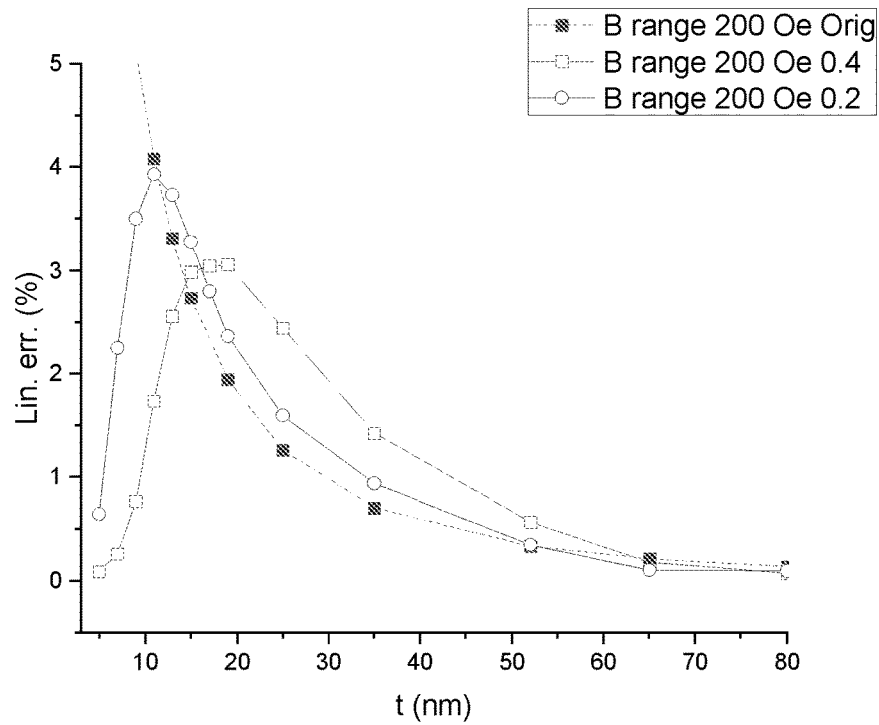
Figure 8:
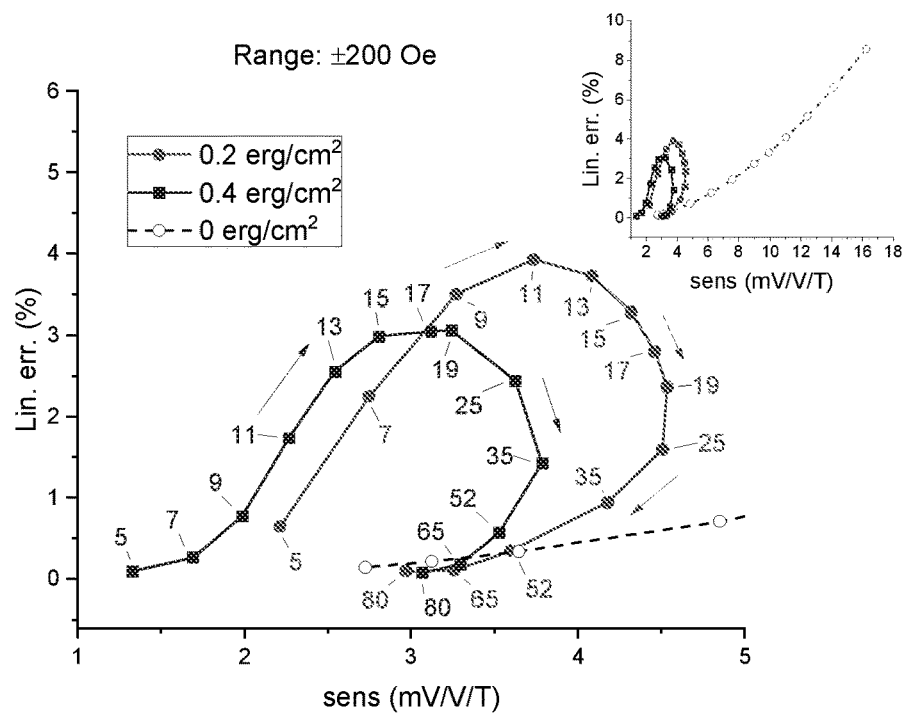
Figure 9:
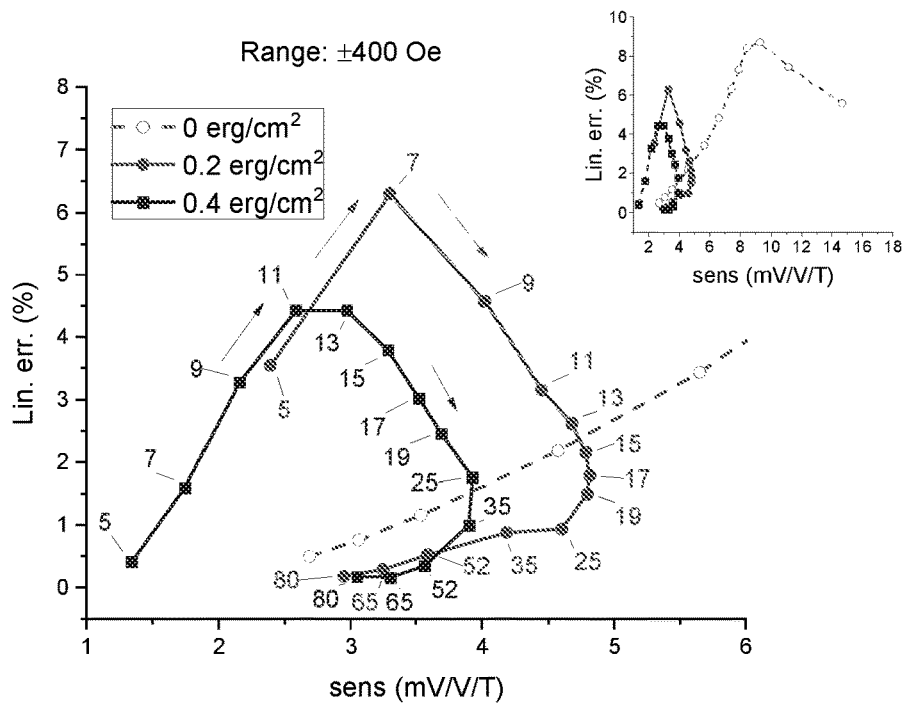

FIG. 6 reports the sensitivity of the magnetoresistive element as a function of the thickness of the sense layer, for a range of the external magnetic field of $\pm1.6\times10^4$ A/m and for a strength of the exchange-bias generated by the sense pinning layer of $2\times10^{-8}$ $J/cm^2$ and $4\times10^{-8}$ $J/cm^2$;

FIG. 7 reports the linearity of the magnetoresistive element response in term of linear error as a function of the thickness of the sense layer, for a range of the external magnetic field of $\pm1.6\times10^4$ A/m and for a strength of the exchange-bias generated by the sense pinning layer of $2\times10^{-8}$ $J/cm^2$ and $4\times10^{-8}$ $J/cm^2$;

FIG. 8 report the linearity of the magnetoresistive element response in term of linear error as a function of the sensitivity of the magnetoresistive element for a strength of the exchange-bias generated by the sense pinning layer of $2\times10^{-8}$ $J/cm^2$ and $4\times10^{-8}$ $J/cm^2$ and for a range of the external magnetic field of $\pm1.6\times10^4$ A/m; and FIG. 9 report the linearity of the magnetoresistive element response in term of linear error as a function of the sensitivity of the magnetoresistive element for a strength of the exchange-bias generated by the sense pinning layer of $2\times10^{-8}$ $J/cm^2$ and $4\times10^{-8}$ $J/cm^2$ and for a range of the external magnetic field of $\pm3.2\times10^4$ A/m.

EXAMPLES OF EMBODIMENTS

Figure 1:
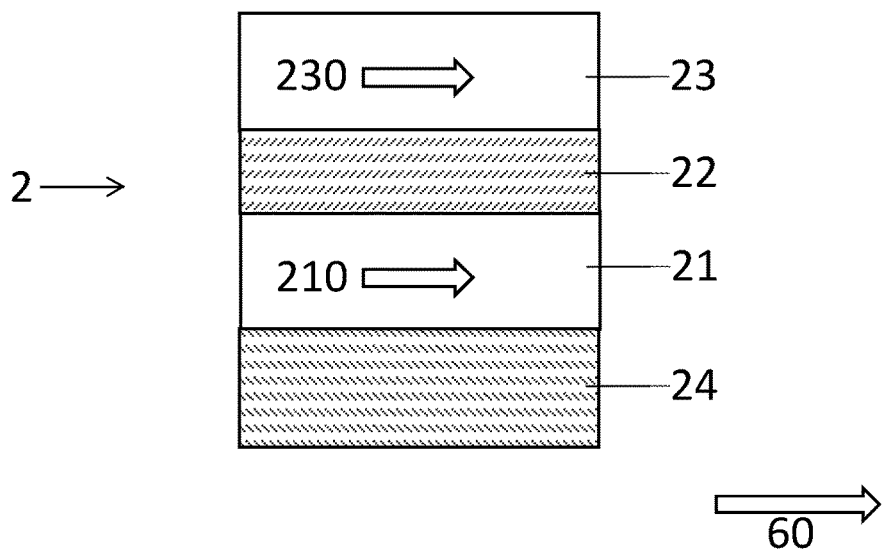
FIG. 1 shows a cross-section view of a conventional magnetoresistive sensor element comprising a sense layer.
Figures 2A, 2B:
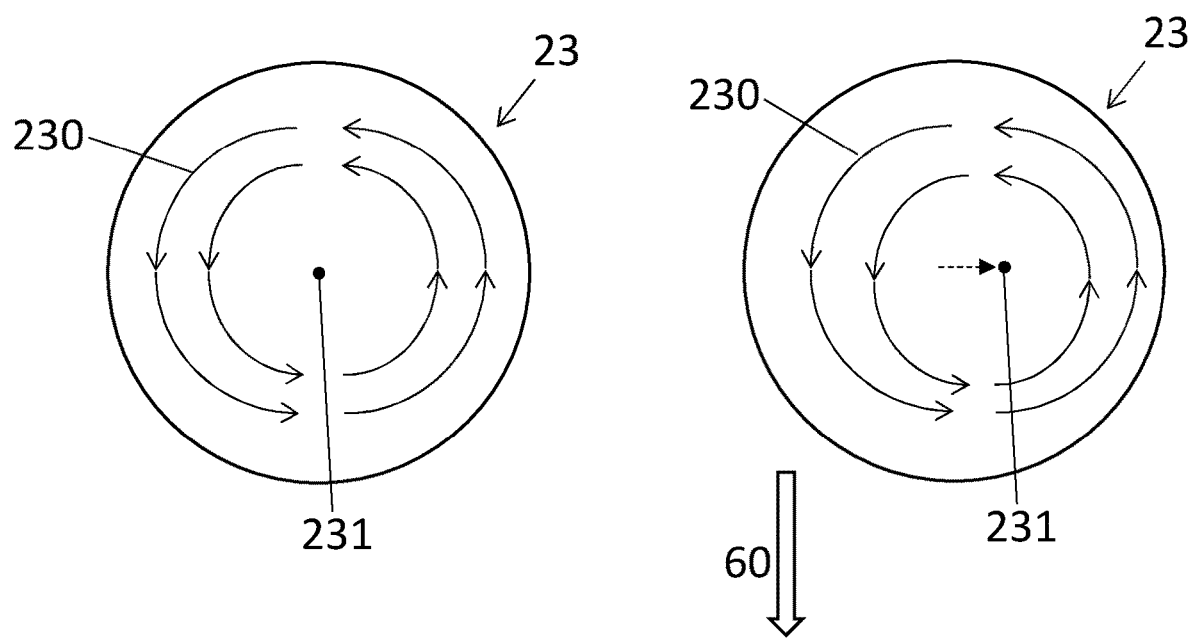
FIGS. 2a and 2b illustrate a top view of the sense layer having a sense magnetization comprising a vortex configuration in absence (FIG. 2a) and in the presence (FIG. 2b) of an external magnetic field.
Figure 3:
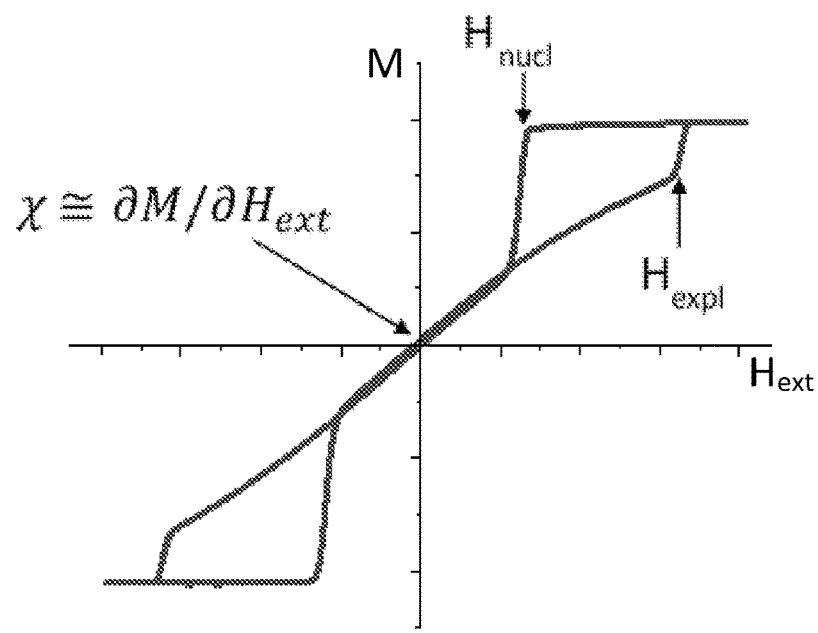
FIG. 3 shows a hysteresis response of the conventional magnetoresistive sensor element.
Figure 4:
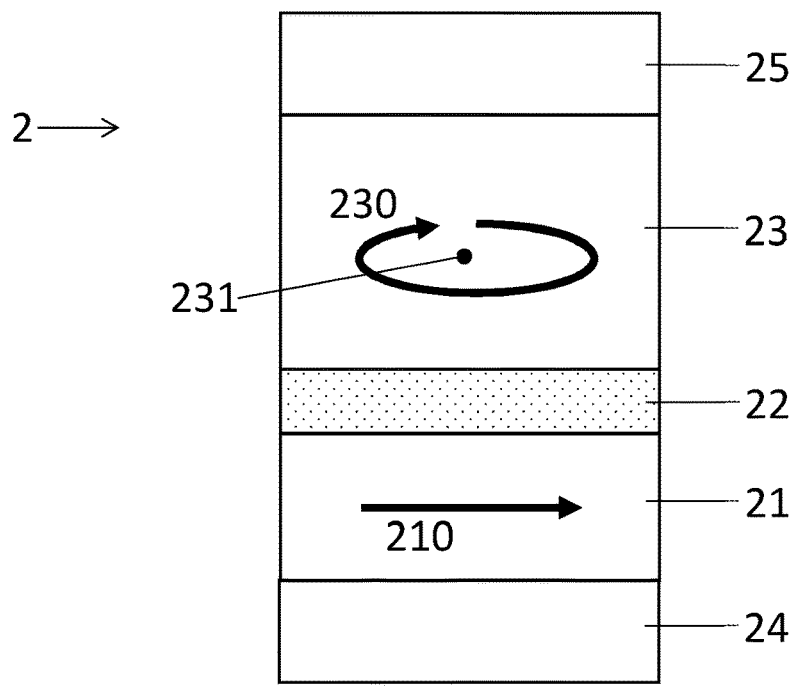
FIG. 4 shows a cross-section view of a magnetoresistive sensor element comprising a sense pinning layer and a sense layer, wherein the sense layer has a sense magnetization comprising a vortex configuration, according to an embodiment.

With reference to FIG. 4, a cross-section view of a magnetoresistive sensor element 2 is shown according to an embodiment. The magnetoresistive sensor element 2 comprises a ferromagnetic reference layer 21 having a reference magnetization 210, a ferromagnetic sense layer 23 having a free sense magnetization 230 and a tunnel barrier layer 22 between the reference and sense ferromagnetic layers 21, 23. The sense magnetization 230 can be oriented in an external magnetic field 60 while the reference magnetization 210 remains substantially undisturbed. The external magnetic field 60 can thus be sensed by measuring a resistance of the magnetoresistive sensor element 2. The resistance depends on the orientation of the sense magnetization 230 relative to the reference magnetization 210.

The sense magnetization 230 comprises a stable vortex configuration rotating in a circular path along the edge of the sense layer 23 and around a core 231, reversibly movable in accordance to the external magnetic field 60. For a given lateral dimension of the magnetoresistive sensor element 2, the thickness of the sense layer 23 is chosen such that the sense layer 23 has a stable vortex configuration magnetisation in the absence of an applied magnetic field.

The reference magnetization 210 is substantially longitudinally oriented in the plane of the reference layer 21. The orientation of the reference magnetization 210 is determined by the exchange coupling (generating an exchange-bias) between the reference pinning layer 24 and the reference layer 21. The reference layer 21 can comprise a synthetic antiferromagnetic (SAF).

In one aspect, the reference and sense layers 21, 23 comprise, or are formed of, a ferromagnetic material such as a cobalt ("Co"), iron ("Fe") or nickel ("Ni") based alloy and preferentially a CoFe, NiFe or CoFeB based alloy. The reference layer 21 can have a thickness between 2 nm and 7 nm. The reference and sense layers 21, 23 can comprise a multilayer structure where each layer can include a ferromagnetic material such as a Co, Fe or Ni based alloy and preferentially a CoFe, NiFe or CoFeB based alloy, and non-magnetic layers such as Ta, Ti, W, Ru, Ir.

The reference and sense magnetizations 210, 230 can have magnetic anisotropy substantially parallel to the plane of the layers 21, 23 (in-plane, as shown in FIG. 4) and/or substantially perpendicular to the plane of the layers 21, 23 (out-of-plane).

The magnetoresistive sensor element 2 further comprises a reference pinning layer 24 pining the reference magnetization 210 by exchange-bias at a first threshold temperature Tb1. The expression "threshold temperature" can correspond to a blocking temperature, such as a Neel temperature, or another threshold temperature of the reference pinning layer 24. The reference pinning layer 24 unpins, or decouples, the reference magnetization 210 when the temperature above the first threshold temperature Tb1.

The magnetoresistive sensor element 2 further comprises a sense pinning layer 25 pining the sense magnetization 230 by exchange-bias at a second threshold temperature Tb2 lower that the first threshold temperature Tb1.

In one aspect, the sense pinning layer 25 can be configured such that the strength of exchange-bias generated in the sense layer 23 by the sense pinning layer 25 is less than that generated in the reference layer 21 by the reference pinning layer 24. For example, the magnitude of the exchange-bias generated in the sense layer 23 by the sense pinning layer 25 is substantially between $2\times10^{-8}$ J/cm$^2$ and $4\times10^{-8}$ J/cm$^2$ (0.2 erg/cm$^2$ to 0.4 erg/cm$^2$).

In some aspects, the thickness of the sense layer 23 can be selected such that the strength of exchange-bias generated in the sense layer 23 by the sense pinning layer 25 allows the sense magnetization 230 can be aligned with respect to the external magnetic field 60 to be measured in a magnetization changeable state.

In some aspects, the reference pinning layer 24 and the sense pinning layer 25 comprises, or is formed of, an antiferromagnetic material pinning the reference magnetization 210 and respectively the sense magnetization 230, through exchange coupling. In particular, the reference pinning layer 24 and the sense pinning layer 25 comprise, or are formed of, a magnetic material of the antiferromagnetic type, including alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn) or alloys based on chromium ("Cr"), NiO or FeO.

In some aspects, the thickness of the reference pinning layer 24 and of the sense pinning layer 25 can be between 4 nm and 15 nm.

The tunnel barrier layer 22 comprises, or is formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 1 nm to about 10 nm. Large TMR for example of up to 200% can be obtained for the magnetic tunnel junction 2 comprising a crystalline MgO-based tunnel barrier layer 22.

Figure 5:
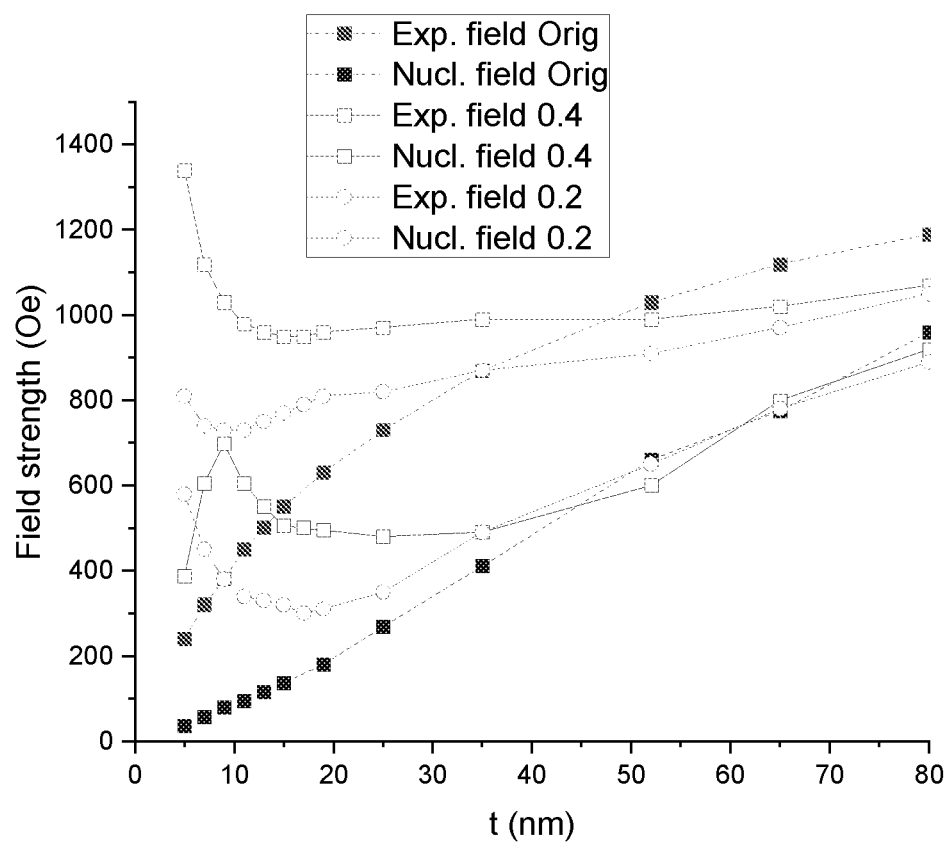
FIG. 5 shows a vortex expulsion field and a vortex nucleation field of the vortex configuration, as a function of the thickness of the sense layer.

FIG. 5 shows the vortex expulsion field $H_{expl}$ and the vortex nucleation field $H_{nucl}$ as a function of the thickness of the sense layer 23. The values of the vortex expulsion field $H_{expl}$ and of the vortex nucleation field $H_{nucl}$ are calculated for a sense layer 23 comprising a NiFe alloy, a TMR of the magnetoresistive sensor element 2 of 140%, a reference magnetization 210 pinned in-plane, i.e., in the plane of the reference layer 21. The calculations were performed for a strength of the exchange-bias generated in the sense layer 23 by the sense pinning layer 25 of $2\times10^{-8}$ J/cm$^2$ and $4\times10^{-8}$ J/cm$^2$. The calculated vortex expulsion field $H_{expl}$ and the vortex nucleation field $H_{nucl}$ as a function of the thickness of the sense layer 23 in the absence of an exchange-bias generated by the sense pinning layer 25 are also shown.

FIG. 5 shows that the strength of the expulsion and nucleation fields $H_{nucl}$, $H_{expl}$ are generally higher for thicknesses of the sense layer 23 smaller than about 40 nm, when the sense layer 23 is subjected to the exchange-bias generated by the sense pinning layer 25 and compared to the expulsion and nucleation fields $H_{nucl}$, $H_{expl}$ in the absence of the exchange-bias generated by the sense pinning layer 25. High values of the expulsion and nucleation fields $H_{nucl}$, $H_{expl}$ can be obtained for a thickness of the sense layer 23 between 15 nm and 80 nm. The higher strength of the expulsion and nucleation fields $H_{nucl}$, $H_{expl}$ allows for increasing the stability of the vortex configuration. It further allows for wider linear response region of the magnetoresistive sensor element 2 and for a reduced change in the response of the magnetoresistive sensor element 2 when the latter is subjected to a high magnetic field used in magnetic permeability testing.

FIG. 6 reports the sensitivity S of the magnetoresistive element 10 as a function of the thickness of the sense layer 23, for a range of the external magnetic field 60 of $\pm1.6\times10^4$ A/m ($\pm200$ Oe) and for a strength of the exchange-bias generated by the sense pinning layer 25 of $2\times10^{-8}$ J/cm$^2$ (open circles) and $4\times10^{-8}$ J/cm$^2$ (open squares). The sensitivity S of a conventional magnetoresistive element not comprising a sense pinning layer 25 is also reported for an external magnetic field 60 of $1.6\times10^4$ A/m (200 Oe) (plain squares). The magnetization vortex state results from an equilibrium between the vortex magnetostatic energy and exchange energy from the sense pinning layer 25. Due to the competition between the magnetostatic energy at larger thickness of the sense layer 23 and increased exchange energy (or pinning field) for small thicknesses of the sense layer 23, a maximum sensitivity S of the magnetoresistive element 10 can be obtained by adjusting the strength of the exchange-bias generated by the sense pinning layer 25. Here, an exchange-bias of $4\times10^{-8}$ J/cm$^2$ yields a sensitivity S between 3 and 5 mV/V/mT for the sense layer 23 having a thickness between 15 nm and 80 nm. Such values of the sensitivity S are suitable for magnetic sensor applications.

FIG. 7 reports the linearity of the magnetoresistive element 10 response in term of linear error in % as a function of the thickness of the sense layer 23, for a range of the external magnetic field 60 of $\pm1.6\times10^4$ A/m ($\pm200$ Oe) and for a strength of the exchange-bias generated by the sense pinning layer 25 of $2\times10^{-8}$ J/cm$^2$ (open circles) and $4\times10^{-8}$ J/cm$^2$ (open squares). The linearity of the response obtained for a conventional magnetoresistive element not comprising a sense pinning layer 25 is also reported as a function of the thickness of the sense layer, for an external magnetic field 60 of $1.6\times10^4$ A/m (200 Oe) (plain squares). FIG. 7 shows that the linear error for a range of the external magnetic field 60 of ±1.6×10⁴ A/m (±200 Oe) can be reduced for the sense layer 23 having a thickness less than 20 nm, compared to that of a magnetoresistive element without the sense pinning layer 25. FIG. 7 shows that the linear error of the magnetoresistive element 10 response, for a range of the external magnetic field 60 of ±1.6×10⁴ A/m (200±Oe) is below 4% for the sense layer 23 having a thickness between 15 nm and 80 nm.

FIGS. 8 and 9 report the linearity of the magnetoresistive element 10 response in term of linear error in % as a function of the sensitivity S of the magnetoresistive element 10 for a strength of the exchange-bias generated by the sense pinning layer 25 of 2×10⁻⁸ J/cm² (plain circles) and 4×10⁻⁸ J/cm² (plain squares). In FIG. 8, the linearity was calculated for a range of the external magnetic field 60 of ±1.6×10⁴ A/m (±200 Oe) and in FIG. 9, the linearity was calculated for a range of the external magnetic field 60 of ±3.2×10⁴ A/m (±400 Oe). The linearity of the response obtained for a conventional magnetoresistive element not comprising a sense pinning layer 25 is also reported as a function of the sensitivity S of the conventional magnetoresistive element, for an external magnetic field 60 of ±1.6×10⁴ A/m (open circles) in FIG. 8 and for an external magnetic field 60 of ±3.2×10⁴ A/m (open circles) in FIG. 9.

For an external magnetic field 60 range of ±1.6×10⁴ A/m and an exchange bias of 2×10⁻⁸ J/cm², a thickness of the sense layer 23 between 15 nm and 80 nm yields a linear error in the response of the magnetoresistive element 10 that is below 3.5%. For larger external magnetic field 60 range of ±3.2×10⁴ A/m and an exchange bias of 2×10⁻⁸ J/cm², a thickness of the sense layer 23 between 15 nm and 80 nm yields a linear error in the response of the magnetoresistive element 10 that is below 2%.

The thickness of the sense layer between 15 nm and 80 nm allows for obtaining strong exchange coupling of the sense magnetization in a portion of the layer near the sense pinning layer and the lesser exchange coupling of the sense magnetization in a portion of the layer far from the sense pinning layer such that vortex behave in a linear fashion in that farther portion, in the presence of the external magnetic field. The thickness of the sense layer between 15 nm and 80 nm allows for combining the effect if the exchange coupling of the sense magnetization (nominal performance being unchanged after the magnetoresistive element has been subjected to high magnetic fields) and obtaining a wide linear response.

A low sensitivity S of the magnetoresistive element 10 response (for example a sensitivity S smaller than 5%) can then be obtained by adjusting the strength of the exchange-bias generated by the sense pinning layer 25 and by adjusting the thickness of the sense layer 23.

According to an embodiment, a method for manufacturing the magnetoresistive element 10 comprises the steps of:
annealing the magnetoresistive element 10 with an applied external magnetic field sufficient to saturate the magnetization of the reference layer 21, and at an annealing temperature higher than the first blocking temperature Tb1, which pins de reference layer 21 in a direction along the direction of the applied magnetic field; and
annealing the magnetoresistive element 10 in the absence of an applied external magnetic field at an annealing temperature higher than the second blocking temperature Tb2 and lower than the first blocking temperature Tb1, which pins the sense layer 21 in a magnetic vortex configuration.

Prior to the annealing steps, the method can comprise forming the magnetoresistive element 10, including the steps of depositing the reference pinning layer 24 and the sense pinning layer 25. The reference layer 21 can be deposited directly on the reference pinning layer 24 and the sense layer 23 can be deposited directly on the sense pinning layer 25.

Forming the magnetoresistive element 10 can further comprise the step of depositing the tunnel barrier layer 22, wherein the sense layer 23 is deposited on the tunnel barrier layer 22. Depositing the tunnel barrier layer 22 can be performed by using an RF magnetron sputtering technique or any other suitable techniques.

In some aspects forming the magnetoresistive element 10 comprises depositing, in this order, the reference pinning layer 24, reference layer 23, tunnel barrier layer 22, sense layer 23 and sense pinning layer 25. The magnetoresistive element 10 can further comprise depositing, in this order, the sense pinning layer 25, sense layer 23, tunnel barrier layer 22, reference layer 23 and reference pinning layer 24.

In an embodiment, a magnetic sensor comprises a plurality of the magnetoresistive element 2 disclosed herein.

REFERENCE NUMBERS AND SYMBOLS 2 magnetoresistive element
21 reference layer
210 reference magnetization
22 tunnel barrier layer
23 sense layer
230 sense magnetization
231 core
24 reference pinning layer
sense pinning layer
60 external magnetic field
$H_{ext}$ external magnetic field
$H_{expl}$ expulsion field
$H_{nucl}$ nucleation field
S sensitivity
$\chi$ susceptibility

The invention claimed is:

1. A magnetoresistive element for a magnetic sensor, the magnetoresistive element comprising a tunnel barrier layer included between a reference layer having a fixed reference magnetization and a sense layer having a free sense magnetization;
the sense magnetization comprising a stable vortex configuration in the absence of an applied magnetic field;
the magnetoresistive element further comprising a reference pinning layer in contact with the reference layer and pining the reference magnetization by exchange-bias at a first blocking temperature; and
a sense pinning layer in contact with the sense layer and pining the sense magnetization by exchange-bias at a second blocking temperature lower that the first blocking temperature,
wherein the sense layer has a thickness between 15 nm and 80 nm, and
wherein the strength of exchange-bias between the sense pinning layer and the sense layer is between $2\times10^{-8}$ J/cm² and $4\times10^{-8}$ J/cm².

2. The magnetoresistive element according to claim 1, wherein the sense pinning layer is configured such that the strength of exchange-bias between the sense pinning layer and the sense layer is lower than the strength of exchange-bias between the reference pinning layer and the reference layer.

3. The magnetoresistive element according to claim 1, wherein the sense layer comprises a CoFe, NiFe or CoFeB based alloy.

4. The magnetoresistive element according to claim 1, wherein the reference pinning layer or the sense pinning layer comprise, or are formed of, an antiferromagnetic material.

5. The magnetoresistive element according to claim 4, wherein the reference pinning layer or the sense pinning layer comprise an alloy based on Ir and Mn, Fe and Mn; Pt and Mn, Ni and Mn, Cr, NiO or FeO.

6. A magnetic sensor comprising a plurality of the magnetoresistive elements according to claim 1.

7. A method for manufacturing a magnetoresistive element comprising a tunnel barrier layer included between a reference layer having a fixed reference magnetization and a sense layer having a free sense magnetization;
   the sense magnetization comprising a stable vortex configuration in the absence of an applied magnetic field;
   the magnetoresistive element further comprising a reference pinning layer in contact with the reference layer and pining the reference magnetization by exchange-bias at a first blocking temperature; and
   a sense pinning layer in contact with the sense layer and pining the sense magnetization by exchange-bias at a second blocking temperature lower that the first blocking temperature;
   wherein the sense layer has a thickness between 15 nm and 80 nm, and the strength of exchange-bias between the sense pinning layer and the sense layer is between $2\times10^{-8}$ J/cm$^2$ and $4\times10^{-8}$ J/cm$^2$;
the method comprising:
depositing the reference pinning layer, reference layer, tunnel barrier layer, sense layer, and sense pinning layer, wherein the sense pinning layer is configured such that the magnitude of the exchange-bias generated in the sense layer by the sense pinning layer is between $2\times10^{-8}$ J/cm$^2$ and $4\times10^{-8}$ J/cm$^2$;
annealing the magnetoresistive element with an applied external magnetic field at an annealing temperature higher than the first blocking temperature; and
annealing the magnetoresistive element in the absence of an applied external magnetic field at an annealing temperature higher than the second blocking temperature and lower than the first blocking temperature.

8. The method according to claim 7,
comprising forming the magnetoresistive element including depositing the reference pinning layer and depositing the sense pinning layer;
wherein the reference layer is deposited on the reference pinning layer and the sense layer is deposited on the sense pinning layer.

* * * * *

UNITED STATES PATENT AND TRADEMARK OFFICE
CERTIFICATE OF CORRECTION

PATENT NO. : 12,204,005 B2
APPLICATION NO. : 18/251296
DATED : January 21, 2025
INVENTOR(S) : Jeffrey Childress et al.

Page 1 of 1

It is certified that error appears in the above-identified patent and that said Letters Patent is hereby corrected as shown below:

In the Specification

Column 8, Line 34, delete "sense pinning layer" and replace with --25 sense pinning layer--.

In the Claims

Column 8, Line 51, Claim 1 delete "pining" and replace with --pinning--.

Column 8, Line 54, Claim 1 delete "pining" and replace with --pinning--.

Column 9, Line 21, Claim 7 delete "pining" and replace with --pinning--.

Column 9, Line 25, Claim 7 delete "pining" and replace with --pinning--.

Signed and Sealed this
Twenty-second Day of July, 2025

Coke Morgan Stewart
*Acting Director of the United States Patent and Trademark Office*